United States Patent [19]

Spence et al.

[11] Patent Number: 5,059,021

[45] Date of Patent: Oct. 22, 1991

[54] APPARATUS AND METHOD FOR CORRECTING FOR DRIFT IN PRODUCTION OF OBJECTS BY STEREOLITHOGRAPHY

[75] Inventors: Stuart T. Spence, South Pasadena; Harry L. Tarnoff, Van Nuys, both of Calif.

[73] Assignee: 3D Systems, Inc., Sylmar, Calif.

[21] Appl. No.: 268,907

[22] Filed: Nov. 8, 1988

Related U.S. Application Data

[63] Continuation-in-part of Ser. No. 182,830, Apr. 18, 1988.

[51] Int. Cl.$^5$ .............................................. G01J 1/00
[52] U.S. Cl. .................................. 356/121; 356/375; 356/398; 425/174; 264/22
[58] Field of Search ............................ 356/121–123, 356/237, 356, 355, 153; 250/347, 239; 425/174, 174.1; 164/35

[56] References Cited

U.S. PATENT DOCUMENTS

| 4,423,437 | 12/1983 | Beck et al. | 250/334 |
| 4,541,876 | 9/1985 | Hwang | 148/22 |
| 4,575,330 | 3/1986 | Hull | 425/174 |
| 4,660,981 | 4/1987 | Stridsberg | 356/375 |
| 4,695,722 | 9/1987 | Motooka | . |
| 4,863,538 | 9/1989 | Deckard | . |
| 4,929,402 | 5/1990 | Hull | 264/22 |

Primary Examiner—Richard A. Rosenberger
Assistant Examiner—Hoa Q. Pham
Attorney, Agent, or Firm—Lyon & Lyon

[57] ABSTRACT

An apparatus and a method for correcting for drift in production of objects by stereolithography is disclosed. A beam sensor comprising a pinhole in a plate and a photodector behind the pinhole is used to obtain the apparent position of the beam at calibration time and subsequently. A comparison between the prior and present apparent position of the sensor is made in order to determine a drift error correction term to be used to compensate for drift and thereby improve the accuracy and pointing repeatability of the scanning mechanism.

20 Claims, 12 Drawing Sheets

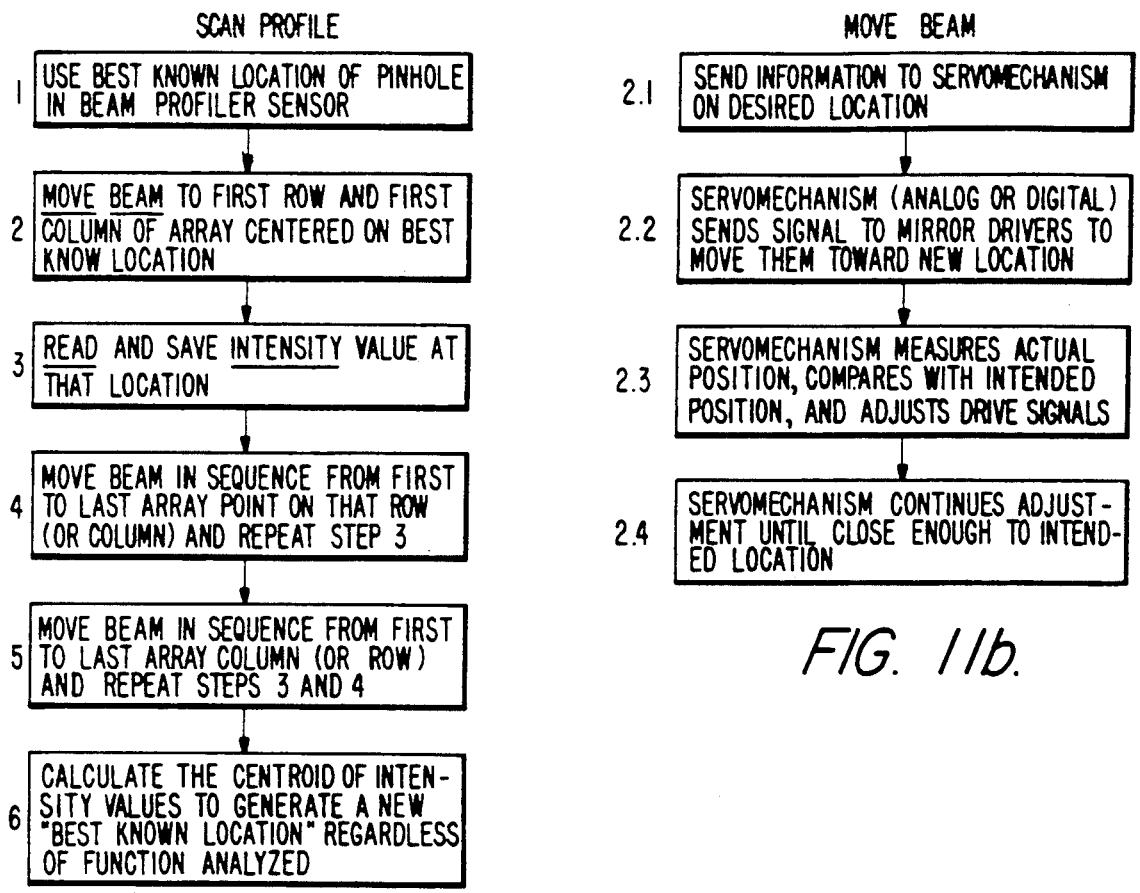
FIG. 11a.
FIG. 11b.
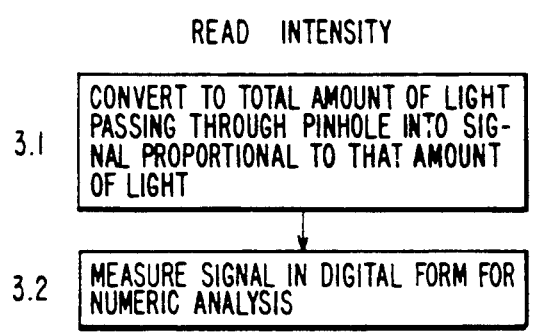
FIG. 11c.

```
+  +  +  +  +  +  +  +  +  +  +  +  +  +  +  +  +  +  +  +  +
+  +  +  +  +  +  +  +  +  +  +  +  +  +  +  +  +  +  +  +  +
+  +  +  +  +  +  +  +  +  +  +  +  +  +  +  +  +  +  +  +  +
+  +  +  +  +  +  +  +  +  +  +  +  +  +  +  +  +  +  +  +  +
+  +  +  +  + ⊕  +  +  +  +  +  +  +  +  +  + ⊕  +  +  +  +
+  +  +  +  +  +  +  +  6  7 12  9  +  +  +  +  +  +  +  +  +
+  +  +  +  +  +  + 15 28 44 39 35 21  7  +  +  +  +  +  +  +
+  +  +  +  +  +  + 20 49 69 72 79 72 46 28  8  +  +  +  +  +
+  +  +  +  +  + 11 49 82 93 85 84 85 76 46 20  5  +  +  +  +
+  +  +  +  +  + 19 64 97 91 77 63 71 73 58 28  8  +  +  +  +
+  +  +  +  +  4 23 69 92 76 66 62 58 70 65 36 10  +  +  +  +
+  +  +  +  +  5 23 63 84 75 68 57 59 76 70 34  9  +  +  +  +
+  +  +  +  +  + 17 50 80 86 76 64 75 82 66 28  7  +  +  +  +
+  +  +  +  +  + 10 32 60 83 82 77 79 69 43 16  +  +  +  +  +
+  +  +  +  +  +  5 16 37 53 69 66 52 41 15  7  +  +  +  +  +
+  +  +  +  +  +  +  5 14 26 26 30 24 13  6  +  +  +  +  +  +
+  +  +  +  + ⊕  +  +  +  6  8  6  7  +  +  +  + ⊕  +  +  +
+  +  +  +  +  +  +  +  +  +  +  +  +  +  +  +  +  +  +  +  +
+  +  +  +  +  +  +  +  +  +  +  +  +  +  +  +  +  +  +  +  +
+  +  +  +  +  +  +  +  +  +  +  +  +  +  +  +  +  +  +  +  +
+  +  +  +  +  +  +  +  +  +  +  +  +  +  +  +  +  +  +  +  +
+  +  +  +  +  +  +  +  +  +  +  +  +  +  +  +  +  +  +  +  +
```

*FIG. 13.*

APPARATUS AND METHOD FOR CORRECTING FOR DRIFT IN PRODUCTION OF OBJECTS BY STEREOLITHOGRAPHY

RELATED APPLICATIONS

This application is a continuation-in-part of U.S. patent application Ser. No. 182,830, filed Apr. 18, 1988. Related applications filed concurrently on that date are U.S. patent application Ser. Nos. 182,823; 183,016; 183,015; 182,801; 83,014; and 183,012, all of which are hereby fully incorporated herein by reference. Continuations-in-part of U.S. patent application Ser. Nos. 182,830, 183,016; 183,014; and 183,012, are being concurrently filed herewith, all of which are hereby fully incorporated herein by reference. These concurrently filed applications are U.S. patent application Ser. Nos. 269,801; 268,837; 268,408; 268,428; and 268,429.

BACKGROUND OF THE INVENTION

This invention relates generally to apparatus and methods for correcting for drift errors in production of objects by stereolithography.

In recent years, "stereolithography" systems, such as those described in U.S. Pat. No. 4,575,330 entitled "Apparatus For Production Of Three-dimensional Objects By Stereolithography," have come into use. The disclosure of U.S. Pat. No. 4,575,330 is hereby incorporated by reference, as if fully set forth herein. Basically, stereolithography is a method for automatically building complex plastic parts by successively printing cross-sections of photocurable polymer or the like on top of each other until all of the thin layers are joined together to form a whole part. With this technology, the parts are literally grown in a vat of liquid plastic. This method of fabrication is extremely powerful for quickly reducing design ideas to physical form and for making prototypes.

Photocurable polymers ("photopolymers") change from liquid to solid in the presence of light and their photospeed with ultraviolet light (UV) is fast enough to make them practical model building materials. The material that is not polymerized when a part is made is still usable and remains in the vat as successive parts are made. An ultraviolet laser may be used which generates a small intense spot of UV light. This spot is moved across the liquid surface with a galvanometer X-Y mirror scanner. The scanner is driven by computer generated vectors or the like. Precise and complex patterns can be rapidly produced with this technique.

The laser scanner, the photopolymer vat, and an elevator, along with a controlling computer, combine together to form a stereolithography apparatus, referred to as an "SLA." An SLA is programmed to automatically make a plastic part by "drawing" one cross-section at a time, and building it up layer by layer.

Stereolithography represents an unprecedented way to quickly make complex or simple parts without tooling. Since this technology depends on using a computer to generate its cross-sectional patterns, a natural data link to CAD/CAM exists.

To be effective, a stereolithography system must have information about the focus, laser beam oscillation mode, beam power, intensity distribution or profile, and scanning system drift of the drawing laser beam in order to carry out the accurate and efficient production of parts (objects made by stereolithography are known as "parts"). The beam must be in relative focus at the surface of the working photopolymer fluid. The laser mode, intensity distribution, and beam power are important to the depth and width of cure of the working fluid, as well as the scan speed. The "drift" of the scanning system must be measured and corrected periodically.

Beam profile (a profile of the intensity of the beam) measurements provide useful information about the beam because they can help accomplish the following purposes: 1. focus optics and correct astigmatism and other aberrations; 2. measure the power of the beam (needed on a day to day basis); 3. study the laser mode and changes of the mode; 4. compensate for drift of the laser scanning system; 5. allow recording of the drift for later analysis of changes; 6. automatically calibrate the scanners; 7. allow easy control of beam position for making other measurements (e.g. to independently measure the beam power in order to find the system's power calibration factor); and 8. permit the prediction of the size and shape of the cured plastic trace.

Accordingly, a need exists for an apparatus and method to correct for the drift of the mirror positioning system, particularly in connection with a stereolithographic apparatus.

SUMMARY OF THE INVENTION

Briefly, and in general terms, the present invention provides a new and improved apparatus and method for correcting for drift of a mirror positioning system so as to provide improved accuracy and repeatability.

In a stereolithographic device, a three dimensional object or "part" may be produced from a medium capable of solidification upon exposure to a reaction means operating in a preselected manner upon a designated surface of the medium. In this manner successive adjacent laminae are built up of solidified medium to form the part.

Thermal effects, wear effects and other effects can cause the positioning means for positioning the reaction means to "drift" so that the reaction means can no longer be repeatably directed to the same location. In order to alleviate such drift errors, the present invention utilizes at least one sensor means capable of detecting application of the reaction means to the sensor means, said sensor means being mounted in a predetermined location fixed with respect to the designated surface of the medium. Positioning means position and apply the reaction means and can apply the reaction means to said sensor means. Current sensor location output means provide current sensor location information indicating the location of the sensor means when the reaction means is applied to the sensor means. Likewise a memory means is utilize to contain past sensor location information which includes a prior apparent location of said sensor means. Means for comparing said current sensor location information and said past sensor location information is provided and is capable of determining a drift correction for use in adjusting the positioning means so as to eliminate drift error effects in the pointing of the reaction means.

The above and other objects and advantages of this invention will be apparent from the following more detailed description when taken in conjunction with the accompanying drawings of illustrative embodiments.

BRIEF DESCRIPTION OF THE DRAWINGS

FIG. 11A is a functional block diagram of the preferred embodiment of the method of generating an intensity profile of a beam according to the present invention;

FIG. 11B is a functional block diagram of a method of moving a beam in carrying out the method described in FIG. 11A;

FIG. 11C is a functional block diagram of a method of reading the intensity of a portion of a beam in carrying out the method described in FIG. 11A;

FIG. 13 is a chart showing a sample intensity profile for a beam generated by a preferred embodiment of the invention.

DESCRIPTION OF THE PREFERRED EMBODIMENT

The stereolithographic system with which the apparatus and method of the preferred embodiment of the present invention is used generates three-dimensional objects by creating a cross-sectional pattern of the object to be formed at a selected surface of a fluid medium, e.g., a UV curable liquid or the like, capable of altering its physical state in response to appropriate synergistic stimulation such as impinging radiation beams, or electron or other particle beam bombardment. For example, radiation solidifiable powders could be used such as plastic powders and sinterable metal powders. Successive adjacent laminae, representing corresponding successive adjacent cross-sections of the object, are automatically formed and integrated together to provide a step-wise laminar or thin layer buildup of the object, whereby a three-dimensional object is formed and drawn from a substantially planar or sheet-like surface of the fluid medium during the forming process. The technique is generally described in the flow charts and diagrams of FIGS. 1–5.

Figure 1:
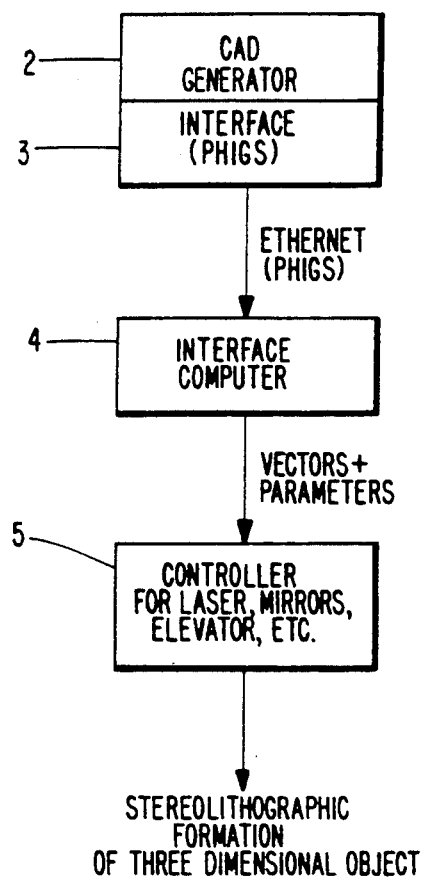
FIGS. 1, 2 and 3 are flow charts illustrating the basic concepts employed in practicing the method of stereolithography.
Figures 2, 3:
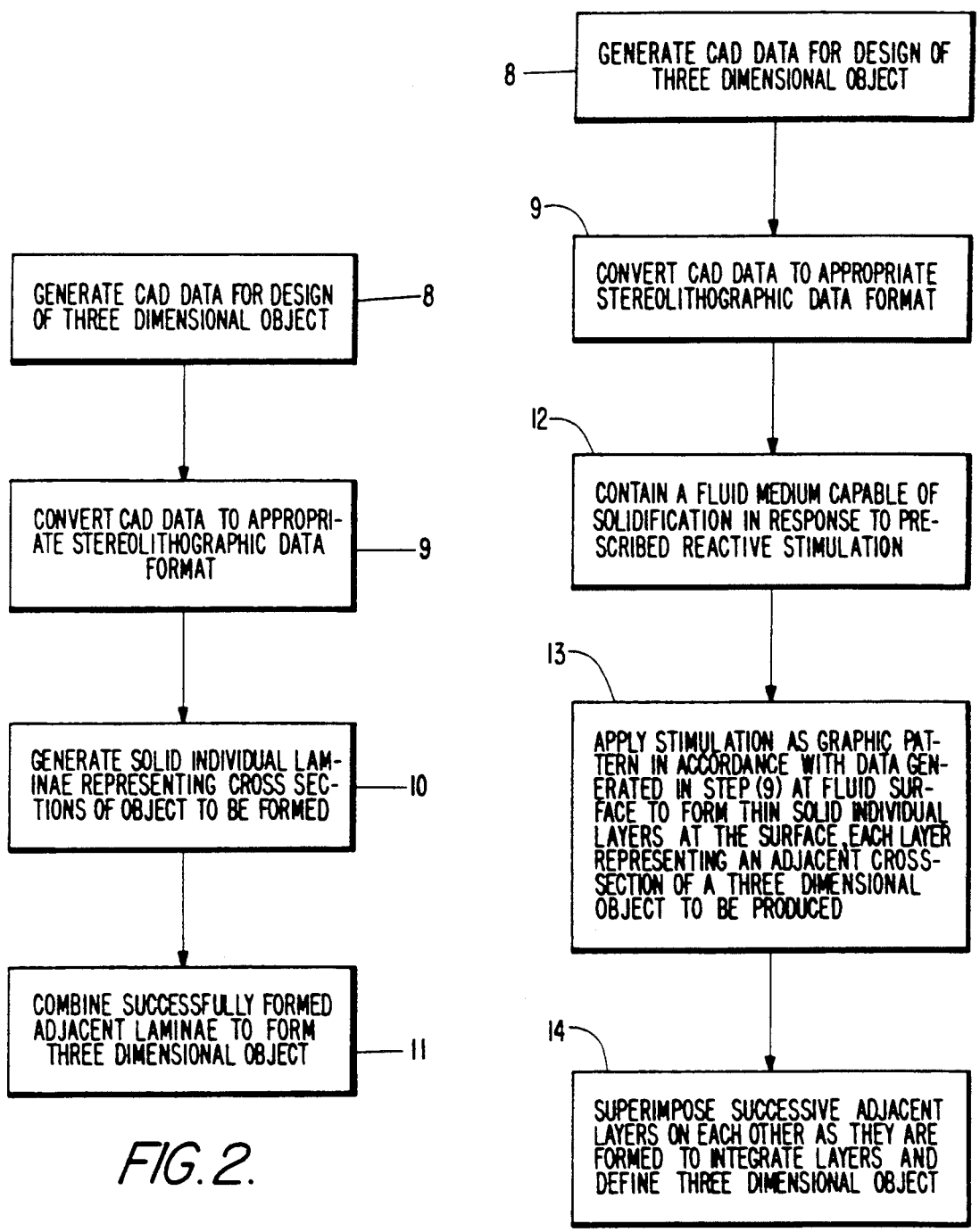
Figure 4:
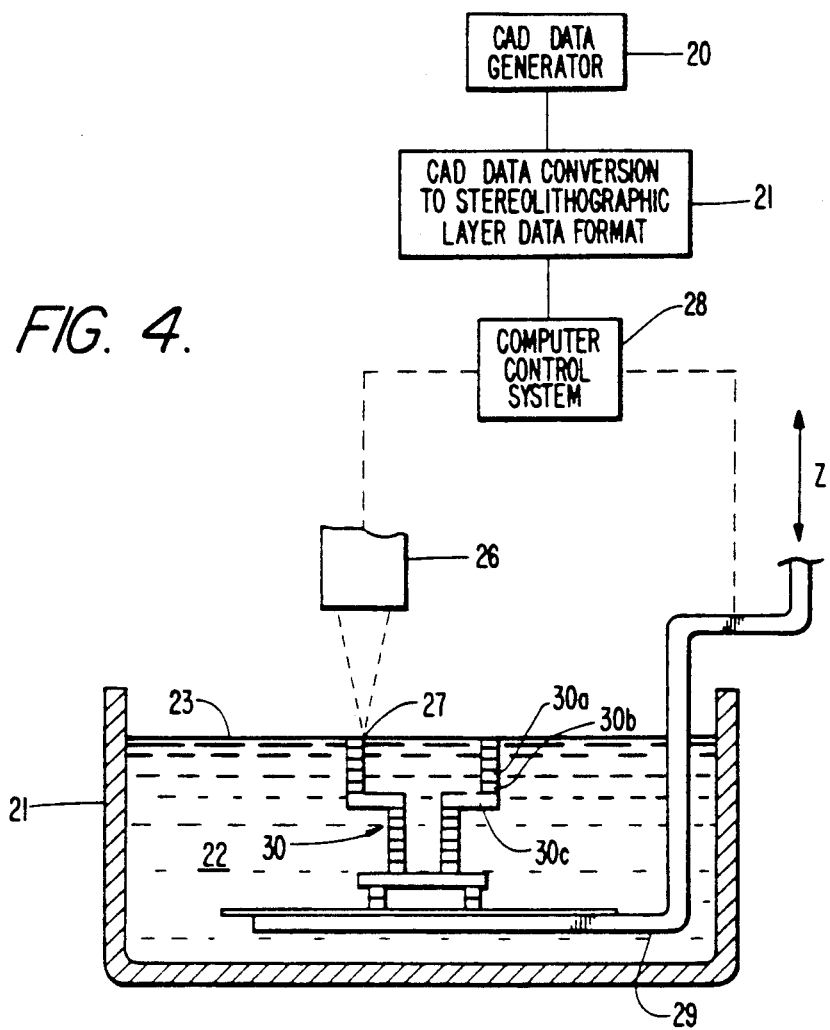
FIG. 4 is a combined block diagram, schematic and elevational sectional view of a stereolithography system.

A stereolithographic system is shown in elevational crosssection in FIG. 4. A container 21 is filled with a UV curable liquid 22 or the like, to provide a designated working surface 23. A programmable source of ultraviolet light 26 or the like produces a spot of ultraviolet light 27 in the plane of surface 23. The spot 27 is movable across the surface 23 by the motion of mirrors or other optical or mechanical elements (not shown in FIG. 4) used with the light source 26. The position of the spot 27 on surface 23 is controlled by a computer control system 28. The system 28 may be under control of CAD data produced by a generator 20 in a CAD design system or the like and directed in PHIGS format or its equivalent to a computerized conversion system 21 where information defining the object is specially processed to reduce stress, curl and distortion, and increase resolution, strength and accuracy of reproduction.

A movable elevator platform 29 inside container 21 can be moved up and own selectively, the position of the platform being controlled by the system 28. As the device operates, it produces a three-dimensional object 30 by step-wise buildup of integrated laminae such as 30a, 30b, 30c.

The surface of the UV curable liquid 22 is maintained at a constant level in the container 21, and the spot of UV light 27, or other suitable form of reactive stimulation, of sufficient intensity to cure the liquid and convert it to a solid material is moved across the working surface 23 in a programmed manner. As the liquid 22 cures and solid material forms, the elevator platform 29 that was initially just below surface 23 is moved down from the surface in a programmed manner by any suitable actuator. In this way, the solid material that was initially formed is taken below surface 23 and new liquid 22 flows across the surface 23. A portion of this new liquid is, in turn, converted to solid material by the programmed UV light spot 27, and the new material adhesively connects to the material below it. This process is continued until the entire three-dimensional object 30 is formed. The object 30 is then removed from the container 21, and the apparatus is ready to produce another object. Another object can then be produced, or some new object can be made by changing the program in the computer 28.

The light source 26 of a stereolithography system according to a preferred embodiment of the invention is typically a helium-cadmium ultraviolet laser such as the Model 4240-N HeCd Multimode Laser, made by Liconix of Sunnyvale, Calif.

A commercial stereolithography system will have additional components and subsystems besides those previously shown in connection with the schematically depicted systems of FIGS. 1–5. For example, the commercial system would also have a frame and housing and a control panel. It should have means to shield the operator from excess UV and visible light, and it may also have means to allow viewing of the object 30 while it is being formed. Commercial units will provide safety means for controlling ozone and noxious fumes, as well as conventional high voltage safety protection and interlocks. Some commercial units will also have means to effectively shield the sensitive electronics from electronic noise sources.

Figure 5:
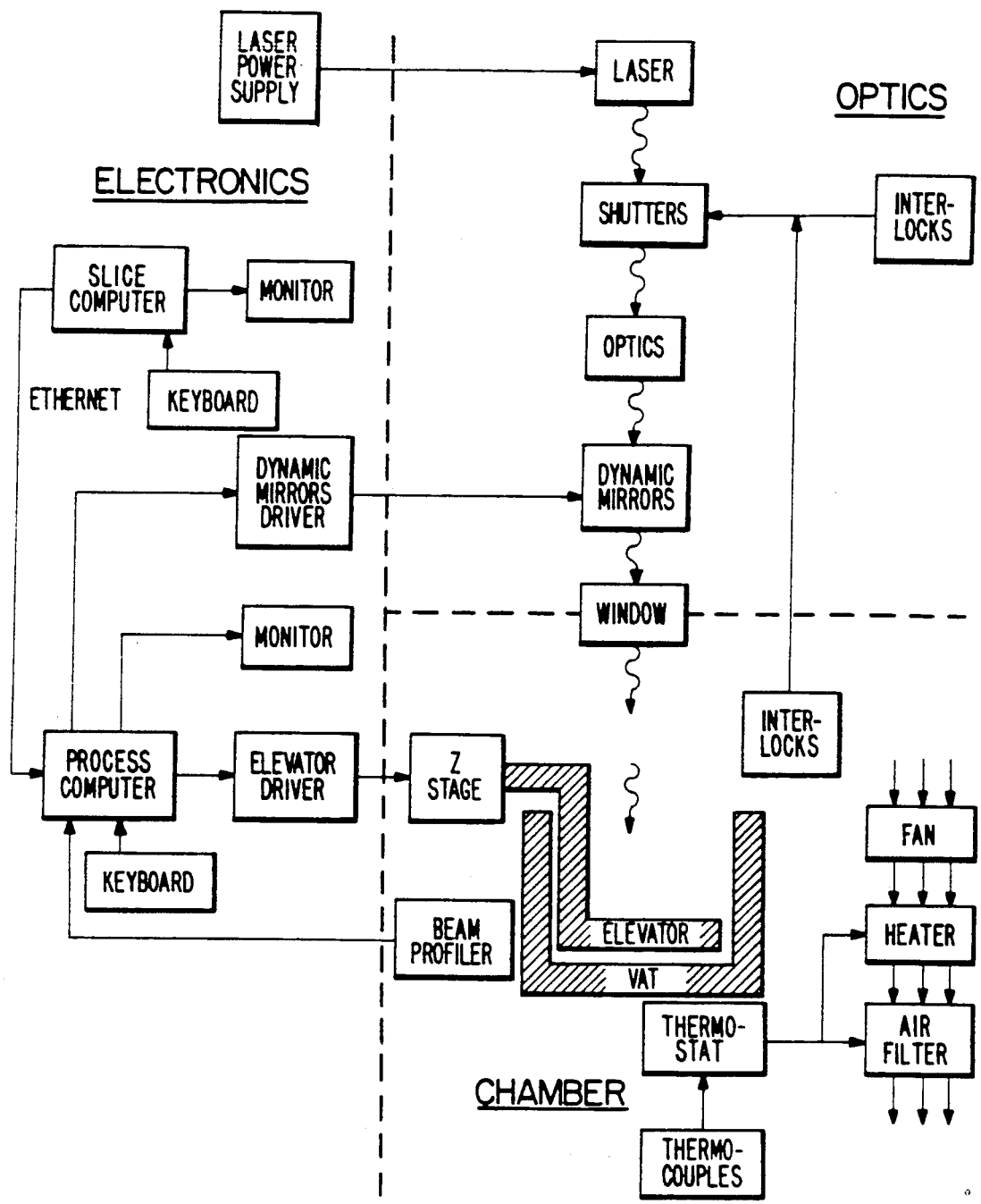
FIG. 5 is a block diagram of a stereolithography system.
Figure 6:
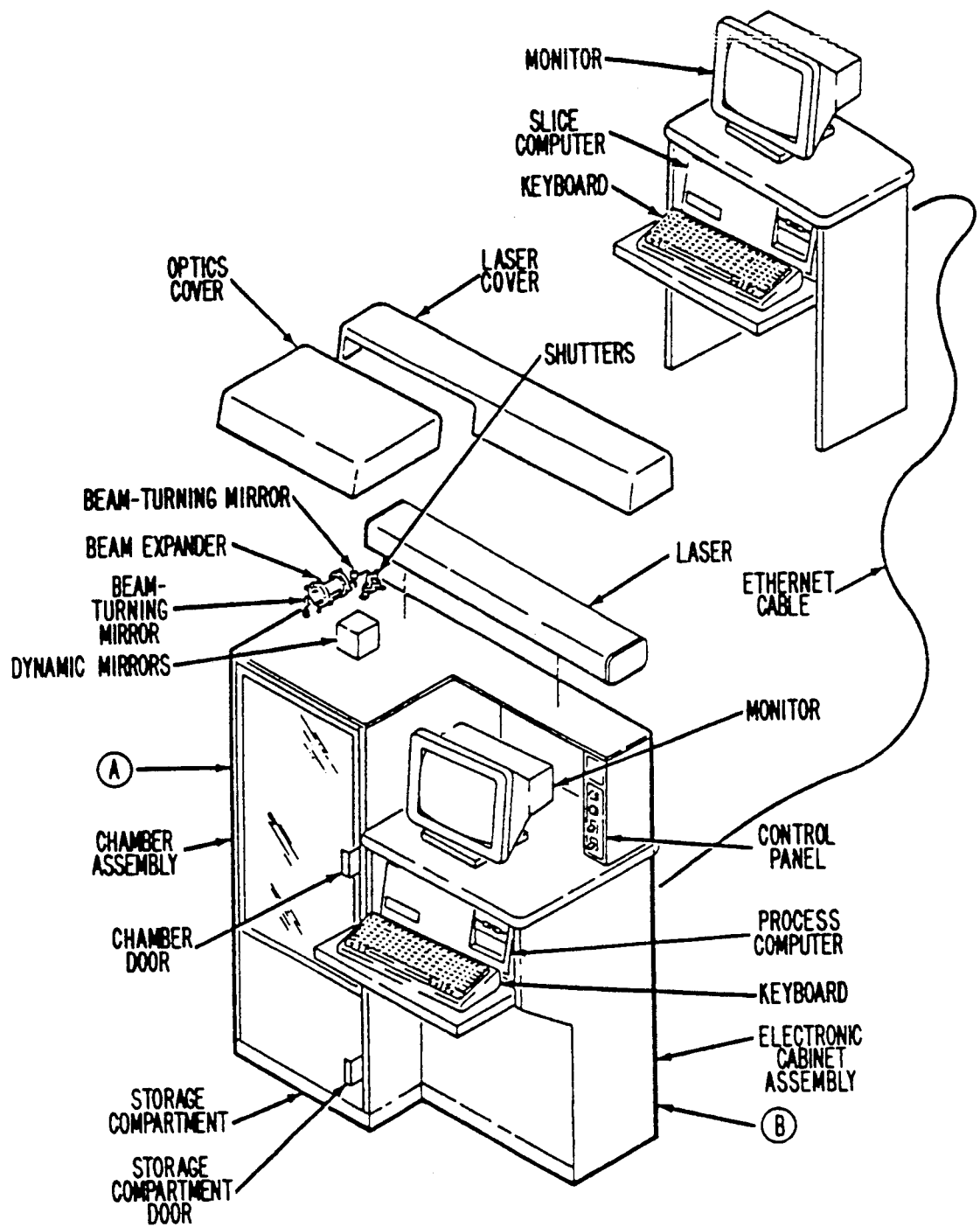
FIGS. 6 and 7a and 7b are exploded perspective views of the major component groups in a stereolithography system.
Figure 7A:
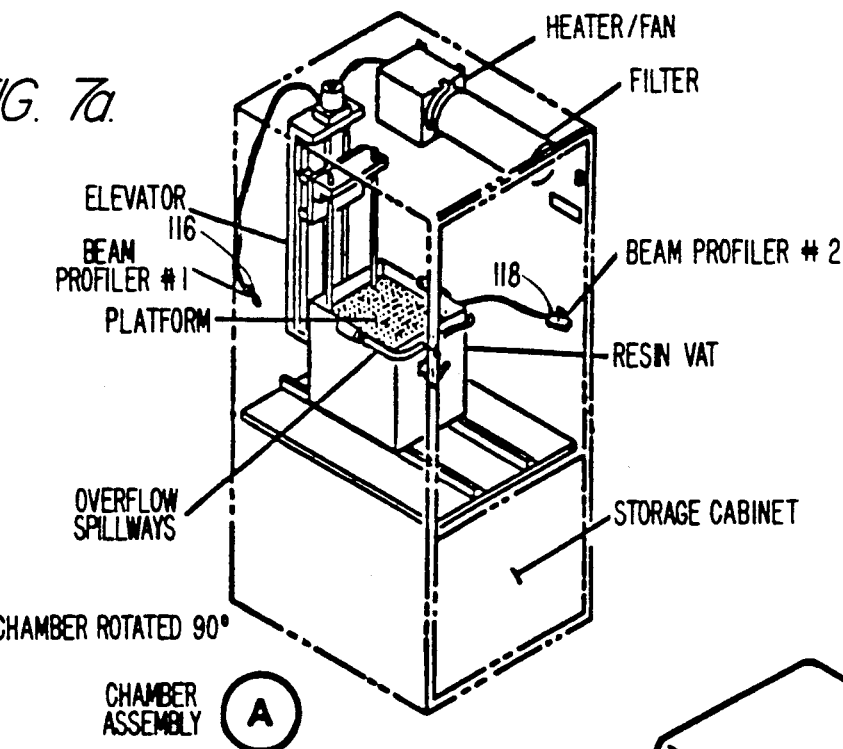
Figure 7B:
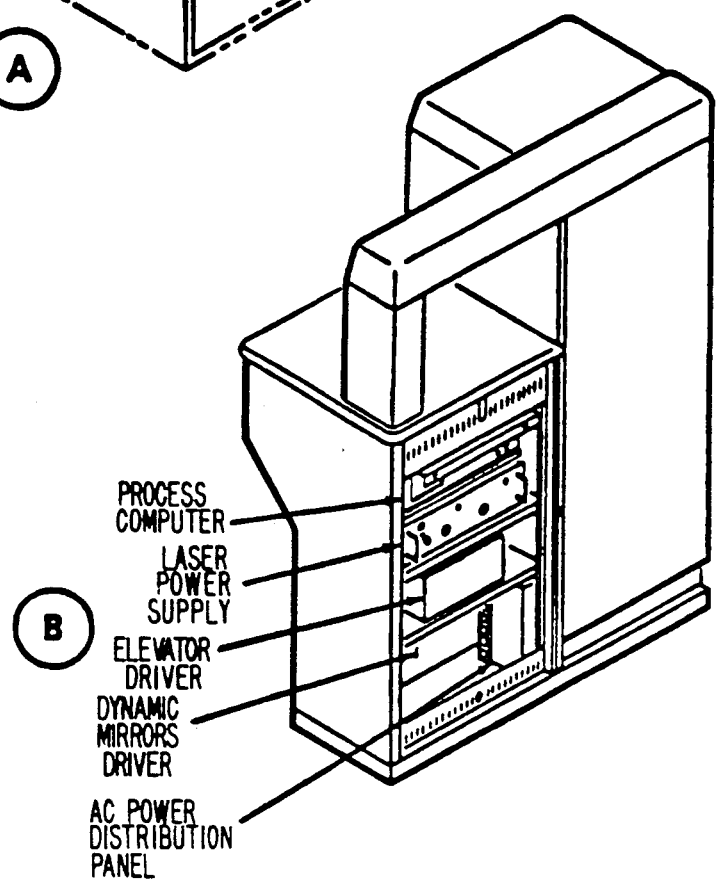

The commercialized SLA is a self-contained system that interfaces directly with the user's CAD system. A commercialized SLA containing the preferred embodiment of the apparatus of the present invention, as shown in FIGS. 6 and 7, consists of four major component groups: the SLICE computer terminal, the electronic cabinet assembly, the optics assembly, and the chamber assembly. A block diagram of the commercialized SLA is shown in FIG. 5.

The electronic cabinet assembly includes the process computer, keyboard, monitor, power supplies, ac power distribution panel, and control panel. The computer assembly includes plug-in circuit boards for control of the terminal, high-speed scanner mirrors, and vertical (Z-stage) elevator. Power supplies for the laser, dynamic mirrors, and elevator motor are mounted in the lower portion of the cabinet.

The control panel includes a power on switch/indicator, a chamber light switch/indicator, a laser on indicator, and a shutter open indicator.

Operation and maintenance parameters, including fault diagnostics and laser performance information, are also typically displayed on the monitor. Operation is controlled by keyboard entries. Work surfaces around the keyboard and computer are covered with formica or the like for easy cleaning and long wear.

Figure 8:
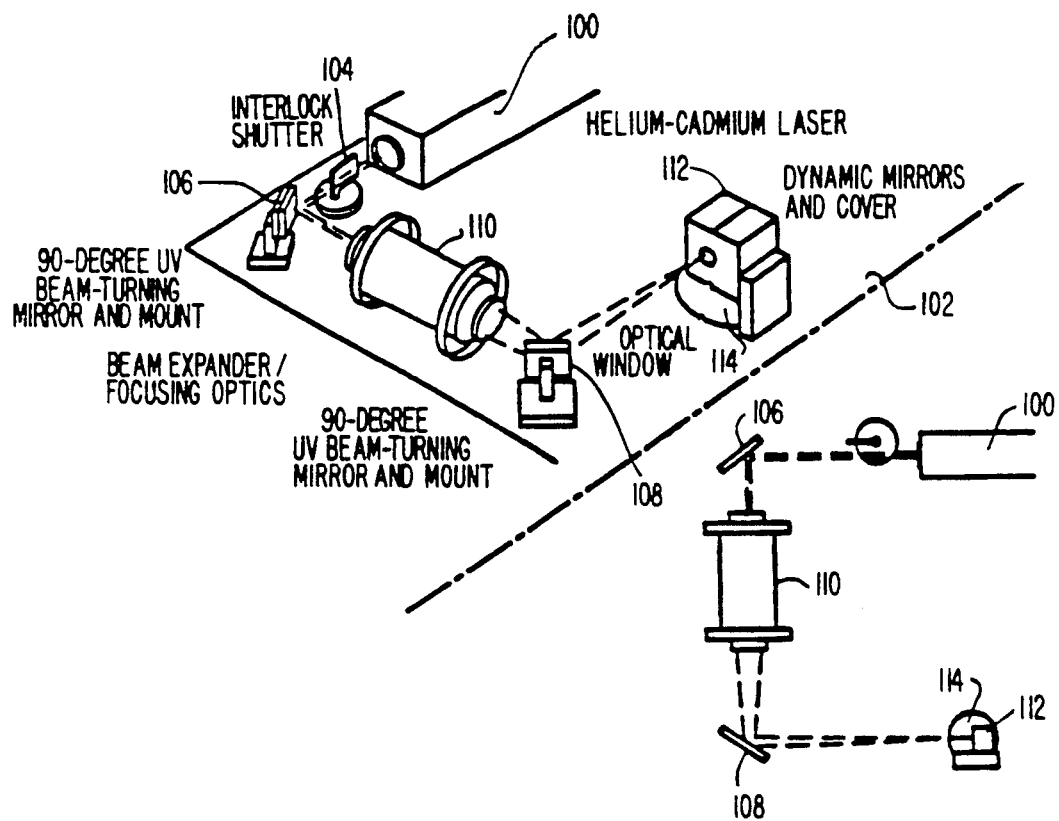
FIG. 8 is a perspective view of the laser and optical system in a stereolithography system which utilizes the preferred embodiment of the present invention.

Turning to FIG. 8, the helium cadmium (HeCd) laser 100 and optical components are mounted on top of the electronic cabinet and chamber assembly 102. The laser and optics plate may be accessed for service by removing separate covers. For safety reasons, a special tool is required to unlock the cover fasteners and interlock switches are activated when the covers are removed. The interlocks activate a solenoid-controlled shutter to block the laser beam when either cover is removed.

As shown in FIG. 8, the shutter assembly 104, two ninety degree beam-turning mirrors 106, 108, a beam expander 110, an X-Y scanning mirror assembly 112, and precision optical window 114 are mounted in the optics plate. The rotary solenoid-actuated shutters are installed at the laser output and rotate to block the beam when a safety interlock is opened. The ninety degree beam-turning mirrors 106, 108 reflect the laser beam to the next optical component. The beam expander 110 enlarges and focuses the laser beam on the liquid surface. The high speed scanning mirrors direct the laser beam to trace vectors on the resin surface. The 2-mirror, 2-axis galvanometer scan heads sold by General Scanning Inc. of Watertown, Mass. have been found to be satisfactory for this purpose and in a preferred embodiment their model DX-2005 servo and model XY-0507 galvanometer X-Y scanning heads are used. A quartz window 114 between the optics enclosure and reaction chamber allows the laser beam to pass into the reaction chamber, but otherwise isolates the two regions.

The chamber assembly contains an environmentally-controlled chamber, which houses a platform, resin vat, elevator, and beam profilers.

The chamber in which the object is formed is designed for operator safety and to ensure uniform operating conditions. The chamber may be heated to approximately 40° C. (104° F.) and the air is circulated and filtered. An overhead light illuminates the reaction vat and work surfaces. An interlock on the access door activates a shutter to block the laser beam when opened.

The resin vat is designed to minimize handling of the resin. It is typically installed in the chamber on guides which align it with the elevator and platform.

The object is formed on a platform attached to the vertical axis elevator, or Z-stage. The platform is immersed in the resin vat and it is adjusted incrementally downward while the object is being formed. To remove the formed part, it is raised to a position above the vat. The platform is then disconnected from the elevator and removed from the chamber for post processing. Handling trays are usually provided to catch dripping resin.

Two beam profiler sensors 116, 118 of FIG. 7 (sensor 35 of FIG. 9a) according to the preferred embodiment of the present invention are mounted at the sides of the resin vat and the focal length of the laser is adjusted to match radial sensor positions (i.e., they are mounted 0.3 inches below liquid level as measured along the radial distance from galvanometer scanner). (See FIG. 7). The scanning mirror is periodically commanded to direct the laser beam onto the beam profiler sensors, which measure the beam intensity profile. The data may be displayed on the terminal, either as a profile with intensity contour lines or as a single number representing the overall (integrated) beam intensity. This information is used to determine whether the mirrors should be cleaned and aligned, whether the laser should be serviced, whether the scanner mirrors have drifted, and what parameter values will yield vectors of the desired thickness and width.

The beam profiler sensors 116, 118 are symmetrically placed relative to the center of the resin vat. (See FIG. 7). They should preferably have similar X and Y offsets as measured from the vat center (of opposite values) although this is not required; that is to say, they are on a diagonal of the stereolithographic apparatus. In FIG. 7, the beam profiler sensors 116, 118 are seen in the corners of the chamber assembly. The distance from the second scanning mirror on the optical plate above the chamber assembly to each beam profiler sensor is the focal length which equals the desired liquid to scanning mirror length plus a small increment. In the SLA-1 sold by 3D Systems, Inc. (which is shown in FIGS. 6 and 7), this liquid to scanning mirror length is 27 inches and the small increment is an additional 0.3 inches, therefore the focal length is 27.3". The distancing of the beam profiler sensors 116, 118 from the second mirror by the desired focal length has the effect of detecting the best average focus for the designated surface of the photopolymer in the SLA-1 resin vat. At the center of the resin vat, when the photopolymer is at the desired level, the focal length of the laser beam will be 0.3 inches below the surface of the photopolymer. The focus of the beam at the surface of the photopolymer in the center of the resin vat will not vary much. At the corner of the 12 inch resin vat of the SLA-1, the focal length will be approximately 1 inch above the surface of the photopolymer. The focal length will be at the surface of the photopolymer at a circle with a 4.2 inch radius about the center of the surface of the photopolymer. The placement of the beam profiler sensor at the focal length is intended to obtain an optimal beam profile considering that the surface of the photopolymer will mostly not be at the focal length of the laser.

Figure 9A:
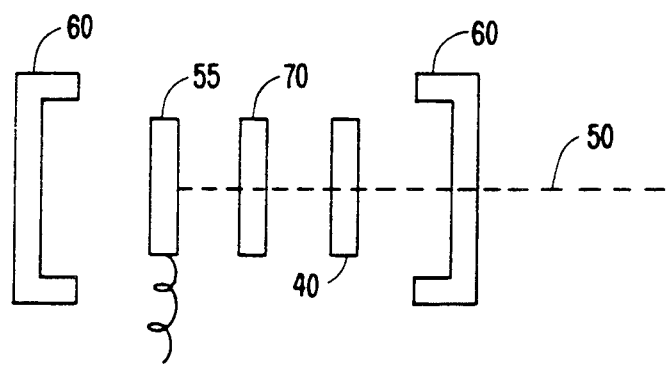
FIG. 9A is a cross-sectional schematic view of a beam profiler sensor of the preferred embodiment of the present invention.
Figure 9B:
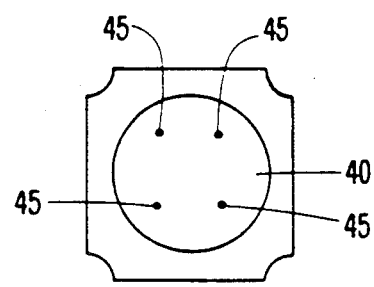
FIG. 9B is a top plan view of a pinhole plate for a beam profiler sensor of the preferred embodiment of the present invention.

FIG. 9A is a cross-sectional view of a beam profiler sensor 35 of a preferred embodiment of the apparatus of the present invention and FIG. 9B is a top plan view of a pinhole plate used in the beam profiler sensor. The beam profiler sensor has a thin stainless steel metal plate 40 having four etched pinholes 45 of varying size. In a preferred embodiment these holes have diameters 0.0005", 0.001", 0.002", and 0.004". The pinholes each permit a small fraction of the laser beam 50 incident upon the pinhole to fall on a photodetector 55 underneath the plate 40. The purpose for providing several pinholes is to permit profiling of beams having a wide range of incident power. One of the pinholes will be best suited for measuring the intensity profile of a beam of a given incident power. For the HeCd lasers used in the SLA-1, a pinhole of 2 mil (0.002 inch) diameter has been found to be satisfactory. The beam is scanned across a selected pinhole in an X Y array to build up a two dimensional profile of the beam intensity.

As may be seen in FIGS. 7 and especially 9A, the beam profiler sensor 5 has a two part housing 60. Light beam 50 enters from the light and moves toward the left in FIG. 9A. The beam profiler sensor is mounted in the corners of the chamber assembly compartment in such a way as to prevent the resin vat from hitting the beam profiler sensor when it is moved into and out of the compartment (see FIG. 7).

Turning to FIG. 9A the beam profiler sensor 35 comprises a split two part housing 60, pinhole plate 40, ultra-violet transmitting filter 70 that absorbs visible light and prevents spurious readings due to visible light. Filter 70 is a two millimeter thickness of Schott UG-11 filter glass which has been found to be acceptable for this purpose in a preferred embodiment. The characteristics of this filter provide reasonable transmission of light in the 300-370 nanometer wavelength region with considerably less transmittance at other wavelengths. A one-millimeter thickness of HOYA U-350 filter material would also be acceptable.

Underneath the filter 70 in the beam profiler housing is a photodiode sensor 55 which detects the ultraviolet light which passes through the filter 70 from the pinhole 45. An EEG Vactec VTS 3072 super blue enhanced photodiode has been found to be acceptable. The output from this photodiode is passed to a current to voltage amplifier (not shown). An OPO7 current to voltage amplifier whose implementation is well known to those skilled in the art has been found to be acceptable.

The pinhole plate 40 of the beam profiler sensor 35 is covered with a quartz filter (not shown). The quartz filter is cleanable and protects the beam profiler sensor from dust and photopolymer drips. The quartz filter should be coated to prevent internal reflections when the photosensor is not perpendicular to the beam, in order to prevent false shape measurements. Otionally a diffuser (not shown) can be used between the pinholes and the sensor to aid the filter to protect the optical components from damage.

Figure 10:
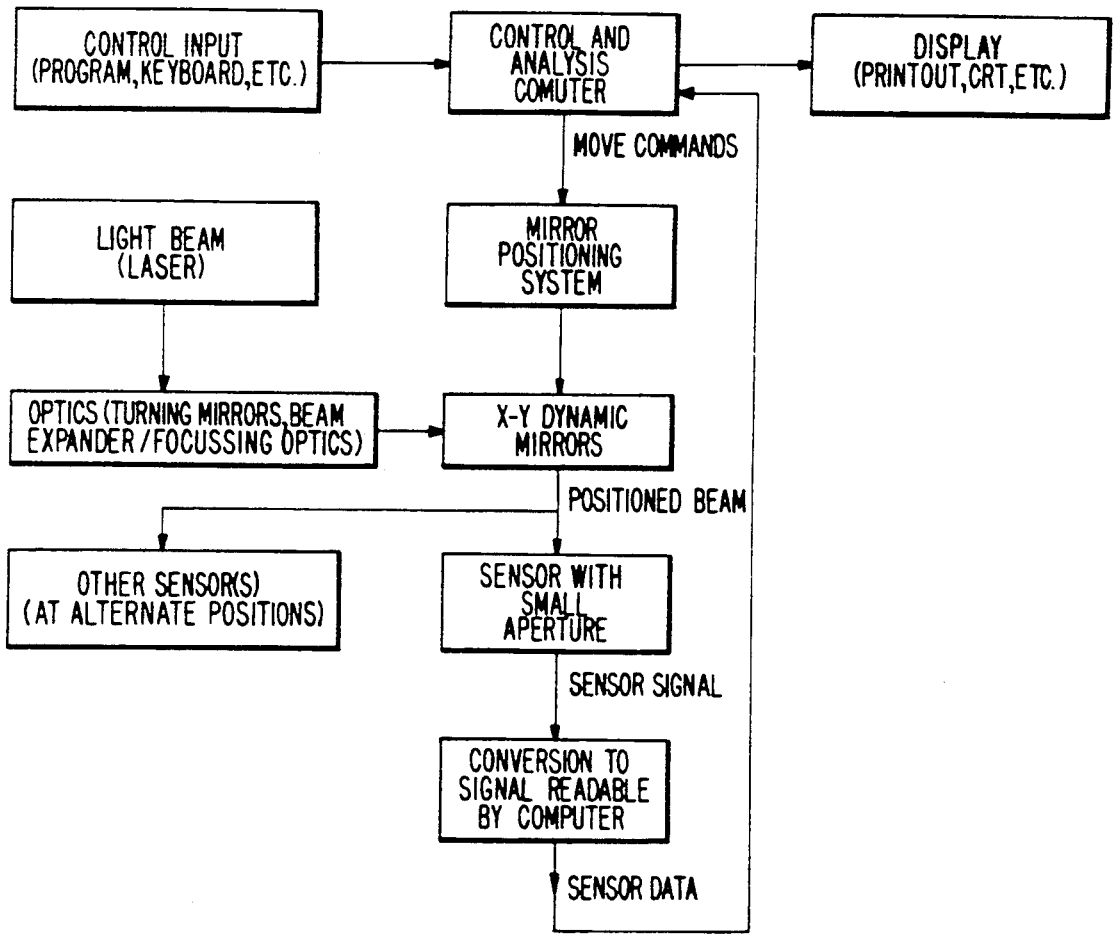
FIG. 10 is a block diagram showing the apparatus of a preferred embodiment of the present invention.

FIG. 10 is a block diagram showing the apparatus of the preferred embodiment of the present invention. Fundamental to the invention is a control and analysis computer. This computer receives inputs from a program, a keyboard or the like and may display results through a printer or terminal or the like. The control and analysis computer sends positioning commands to a mirror positioning system which controls the X Y scanner mirrors. The laser beam is focused by the optics shown in FIG. 8 to reach the X Y scanner mirrors and is directed by those mirrors to one of the beam profiler sensors. The use of two beam profiler sensors is recommended for the purpose of drift correction. The sensor signal from the beam profiler sensors is converted to a signal readable by the computer which is then sent back to the control and analysis computer to be manipulated as described hereafter.

In physical terms, the beam profile method according to the present invention causes the beam to be moved to each of the points of an array on the pinhole plate centered on the best known position of the pinhole. As a result, different sectors of the beam will fall on the pinhole and will be transmitted through the same to be detected by the photodiode and converted into a numerical signal that can be analyzed by the computer. A profile of the intensity of different sectors of the beam will be built up by the computer (see FIG. 13). This is the "intensity profile" of the beam.

FIG. 11A is a functional block diagram showing how a beam profile is developed according to the preferred embodiment of the invention. The best known location of a pinhole on the beam profiler sensor is called up from memory by the control and analysis computer and sent to the mirror positioning system to position the X Y scanner mirrors to direct the beam at this best known location. The control and analysis computer, through the beam positioning system, moves the beam to the first row in the first column of a square array centered on the best known location. The intensity of the portion of the beam entering the pinhole as detected by the beam profiler sensor is then read and is saved as well as the mirror position commands which are associated with that intensity. The beam is then moved in sequence from the first to the last array points on a particular row or column and the reading and saving intensity value steps are repeated. The beam is then moved in sequence from the first to the last array columns or rows and the moving and reading steps are then performed down each column or row. The result is that beam intensity readings are taken for each of the positions on the array (a "position" is known to the computer as a set of mirror positioning commands). A standard analysis, performed by the control and analysis computer of the array of intensity values is usually performed to generate a new best known location of the pinhole (for use in performing the first step of the scan profile the next time) regardless of the detailed function actually being analyzed (see FIG. 12).

FIG. 11B is a functional block diagram of a method of moving a beam and carrying out the method described in connection with FIG. 11A. To move the beam, the first step is to send the beam positioning information to the servomechanism of the X Y scanner mirrors concerning the desired location. The servomechanism which may be analog or digital) then sends a signal to the mirror drivers to position the X Y scanner mirrors to a new location. The servomechanism of the X Y scanner mirrors measures the actual position of the mirror drivers and compares the actual position with the intended position and adjusts the drive signals accordingly. The adjustments are continued within specification values of the intended location.

FIG. 11C is a functional block diagram of a method of reading the intensity of a portion of a beam and carrying out the method of the preferred embodiment of the present invention. The first step is to convert the total amount of light which passes through the pinhole into a signal which is proportional to that amount of light. In the preferred embodiment, this process is performed by the photodiode which measures the light coming through the pinhole and the filter. The current from the photodiode is sent to a current to voltage amplifier which generates a signal proportional to the amount of light received by the photodiode. Amplification of the signal (which will be proportional to intensity) is important to obtain small but significant readings for the edge of the beam which would otherwise be lost. The next step is to measure the signal, which is proportional to the amount of light received, after the signal is converted into a digital form for numerical analysis.

Figure 12:
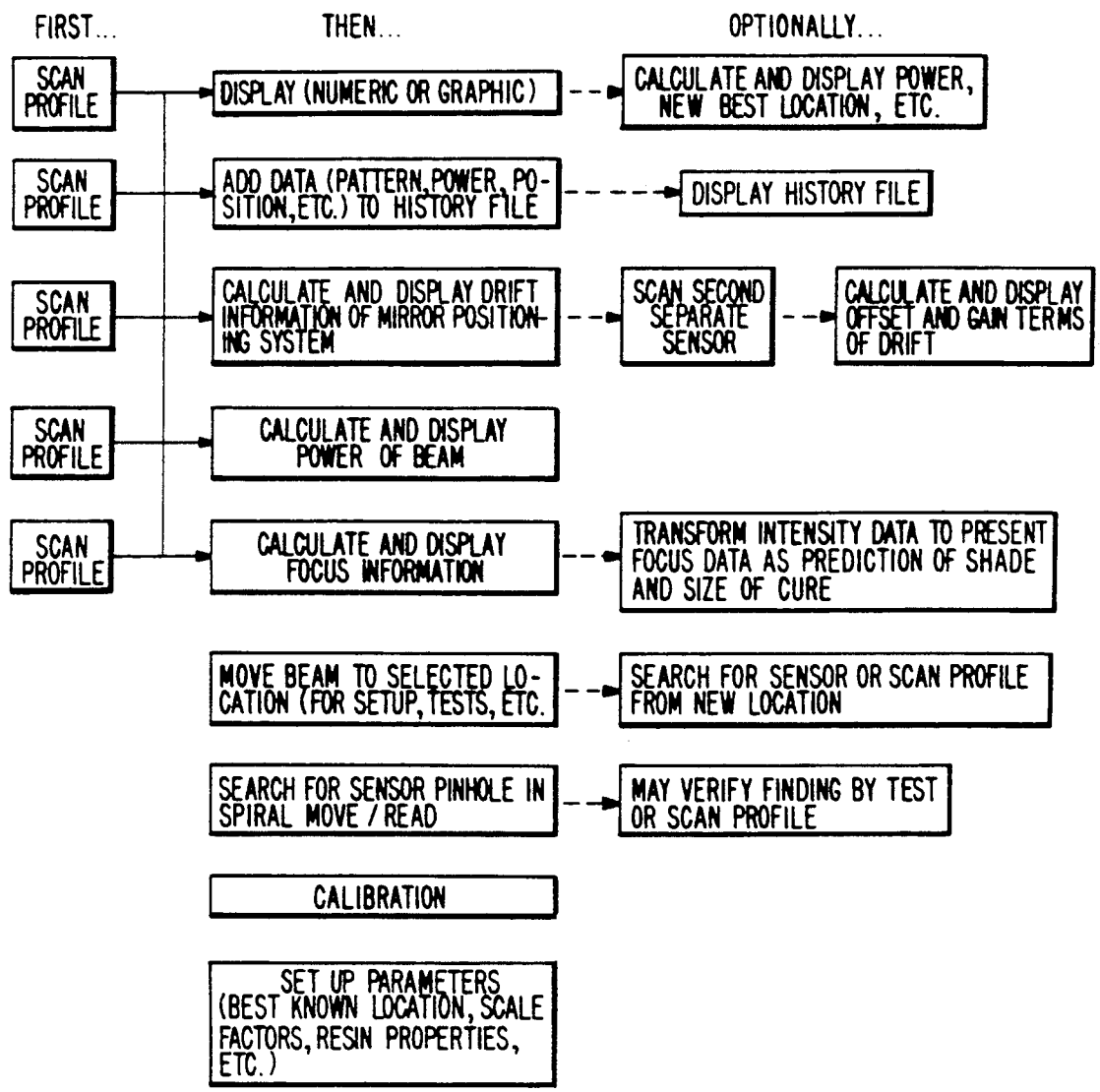
FIG. 12 is a functional block diagram showing process and analyses which may be coupled with the method described in FIG. 11A.

FIG. 12 is a functional block diagram showing the processes and analyses which may be coupled with the method described in FIG 11A. As may be observed from that figure, a number of different processes and analyses may be selected from a menu, the first five of which are connected to the scan profile routine of FIG. 11A. The first step is to scan the intensity profile of the beam according to the method described in connection with FIG. 11A. The intensity profile may be displayed numerically or in the form of a graph. As an option, the power may be calculated from the intensity profile as well as a new best known location of the pinhole used. Another possible process is to add the data generated in connection with the beam intensity profile to a history file with an option of displaying the history file. A further possible process is to calculate and display drift information for the mirror positioning system which generally involves scanning a second separate sensor (in the case of the preferred embodiment, another beam profiler sensor) and then calculating and displaying the offset and gain terms of the drift. Another process is to calculate and display the power of the beam, which involves summing up the intensities of a profile and multiplying by a power conversion factor. The power conversion factor can be determined, for example, by utilizing the process with a beam of known power or by comparing calculated power to that of a calibrated sensor and determining the required gain factor. A further function is to calculate and display focus information, with a possible option of using a special transformation of the intensity data used to calculate focus information and the use of known resin properties to predict the shape and size of the cured traces of photopolymer. Another possible function is to move the beam to the desired location for set up (to make parts), tests and so forth with an option for searching for the sensor or scan profile from this new location. A useful function is to search for sensor pinholes in a spiral move-read format. This may be necessary if the best known location of the pinhole is not accurate, in case when the array is traced over the best known location the pinhole is not detected. A further step may be to verify findings (of pinhole location) by test or scan profile. A still further function is the use of the beam profilers in calibration, which involves the measurement of the drift while obtaining a calibration map for the surface corresponding to the surface of the photopolymer. A final function is to store in the machine the parameters of best known location, scale factors, resin properties, and so forth.

FIG. 13 is a chart showing a sample intensity profile for a laser beam as generated by a preferred embodiment of the present invention. The numerical values correspond to the measured intensity of a beam from a preferred embodiment of the present invention.

The intensity profile generated by the present invention may be used to calculate the power of the beam and to predict the shape and dimension of a cured trace of photopolymer (the solidified photopolymer due to exposure to the beam of UV light), as the following discussion will demonstrate.

The intensity of the beam is measured by the beam profiling apparatus when the beam is directed at each point of an array on the pinhole plate, which is a surface generally perpendicular to the optical path taken by the beam. The X and Y directions on this surface correspond to the directions taken by the beam when one or the other of the scanning mirrors rotate.

A description of the operation of the beam profile sensor and of beam profiling in general is contained in U.S. patent application Ser. Nos. 182,830 and 268,816 incorporated herein by reference.

DRIFT CORRECTION

Drift correction is a procedure which compensates for drift of, inter alia, the mirror positioning system by periodically checking on the apparent position of one or more beam profile sensors (herein referred to as "sensor means"). Measurements of changes in the apparent position of a single sensor allow for compensation for drift of the "zero setting" of the mirror system, two separate sensors allow additionally for correcting for otherwise uncompensated gain in the system and/or otherwise uncompensated changes in size of parts of the SLA due to thermal and other effects. Other errors can be corrected by utilization of even more sensors although in a preferred embodiment of the present invention two beam profile sensors are deemed sufficient.

In a preferred embodiment of the present invention, a calibration operation is periodically performed. In the calibration procedure, a plate having a number of holes and sensors is utilized to generate in system memory a table of mirror position settings which correspond to fixed predetermined locations on the plate.

During the time a calibration is being run, the system periodically checks on the apparent locations of two sensors. These measurements are used to correct the calibration measurements for this amount of drift, so that the values are all normalized to a "standard" pair of apparent positions of the two sensors. When later building a part, the same two sensors are again scanned periodically, and the apparent positions can be used to correct for changes in the zero and gain of the mirror system relative to the time at which the calibration was made. This procedure has been found to remove 90% of the error caused by drift of the mirrors.

A description of the calibration procedure is contained in U.S. patent application Ser. Nos. 182,830 and 268,837 incorporated herein by reference.

In the drift compensation method and apparatus of a preferred embodiment of the present invention two beam profile sensors capable of detecting when the laser beam is directed toward them by the mirror positioning system are mounted fixedly in predetermined locations fixed with respect to a designated surface of the solidifiable working medium upon which the reaction means impinges to solidify said medium.

Periodically the laser beam is directed toward the sensors and sensor location output means provide a readout of the apparent location of the sensors. The current apparent location of the sensors are compared with a past apparent location of the sensors which is stored in memory and a difference indicates the need for a drift correction.

For example, when a single sensor No. 1 is in use, this sensor No. 1 had a past apparent position of $X=20$, $Y=20$ and a current apparent position of $X=22$, $Y=22$ then a drift of $+2X$ and $+2Y$ has occurred and the mirror positioning system can apply an appropriate correction factor in order to point the beam in the desired location. As another example when in addition to this first sensor, a second sensor is used, then the second sensor might be read at calibration to be $X=64000$, $Y=64000$ and have a current apparent position of $X=64004$, $Y=64003$. Were this the case, in addition to a linear shift of $+2X$, $+2Y$ across the entire system (the two sensors conveniently being located on a diagonal) there would also be a gain or stretching of $+2X$, $+1Y$ of the apparent distance between sensors No. 1 and No. 2 and we expect and correct for proportionately different stretching for different locations relative to the sensor No. 1. In compensating, linear interpolation could be used to help the mirror positioning system compensate for the gain term in the drift error.

To achieve more accurate part-building using stereolithography, a special computer software algorithm was developed. This algorithm, known as the Drift Correction algorithm, can be considered having two parts.

The first part is code that determines the value of the variable used in drift correction. The second part is code for the application of these variables to correct for drift.

The drift correction variables are:
the X-axis gain: called DriftGainX in our examples
the X-axis offset: DriftOffsetX
the Y-axis gain: DriftGainY
the Y-axis offset: DriftOffsetY The variables are used to compute a correction factor that is applied to all X,Y coordinate positions of the laser mirrors. This correction is applied to each axis separately and has a gain (multiplier) and offset (addition) term for each axis. It is in the form:

corrected axis value = (gain * desired axis distance from first sensor) + offset of first sensor where the gain and offset variables map the ideal desired axis position to the corrected real-world position based on measurements.

The drift correction variables are determined at the start of each laser through the use of Beam Profiling algorithms very similar to hose found in the Beam program. The position of two beam profile sensors at opposite corners of the vat is measured and calculated and compared to the ideal positions remembered in a disk data file. The differences between these two sets of profile sensors positions determines the value of the drift correction variables. Placement of the two profile sensors at the corners of the scanning field optimizes the baseline along both X and Y axes from which to measure changes in gain.

The Pascal function below is a sample for computing the values of the drift correction variables. The 'Ref' variables are the reference positions of the two beam profile sensors read from the disk data file. The 'Now' variables are the most recently determined positions of the two profile sensors. Because of dynamic changes in the physical characteristics of the laser scanning system, the positions held in the 'Now' variables will differ slightly from the ideal reference positions. The goal is to use these position differences to adjust upcoming mirror positions

```
{
    CorrectForDrift -- compute value of drift correction
variables
}
procedure CorrectForDrift;
var
    quotient: Float Type;
begin
    DriftGainX    := (Sensor2_NowX - Sensor1_NowX) /
                     (Sensor2_RefX - Sensor1_RefX;)
    DriftOffsetX  := Sensor1_NowX;
    DriftgainY    := (Sensor2_NowY - Sensor1_NowY)/
                     (Sensor2_RefY - Sensor1_RefY;)
    DriftOffsetY  := Sensor1_NowY;
```
-continued
```
end;
```

The Pascal procedure below shows how a coordinate pair can be corrected for drift once the drift correction variables have been determined. Note that the correction for each axis is separate from the other.

```
{
    DriftCorrect -- correct coordinate pair for drift
}
procedure DriftCorrect(oldX,oldY: FloatType;var newX,newY:
FloatType);
begin
    newX    := (oldX - Sensor1_RefX) * DriftGainX +
               DriftOffsetX;
    newY    := (oldY - Sensor1_RefY) * DriftgainY +
               DriftOffsetY;
end;
```

The DriftCorrect procedure is used to correct the start and the end of each drawing vector before it is converted to a "feature" which is a highly optimized form of a laser drawing used within 3D Systems software. The CorrectForDrift is used only once per laser, after the new position of the two beam profilers has been determined.

In practice, these routines are located within a special memory resident driver (known as STEREO) that different stereolithography application programs can use. The application program is responsible for finding the profiler location, and it passes this information along to the special device driver.

| BUILD | STEREO |
| --- | --- |
| an applications program used to build parts; it → passes along profile position info for each layer | the memory-resident driver that performs several Stereolithography related tasks, one of which is drift correction |

An equivalent drift correction procedure is performed on all of the calibration points during the calibration of the SLA. In a presently preferred embodiment, drift is determined at the end of a scan of each row of predetermined fixed positions and the correction is applied through linear interpolation for that row. A method of actual software implementation of such a routine for compensation would be well within the capabilities of one of ordinary skill in the art and therefore will not be further described herein although actual software for drift correction in an actual embodiment of the SLA-1 is included in the Technical Appendix to patent application Ser. No. 182,830 already incorporated herein by reference.

It will be apparent from the foregoing that, while particular forms of the invention have been illustrated and described, various modifications can be made without departing from the spirit and scope of the invention. Accordingly, it is not intended that the invention be limited, except as by the appended claims.

What is claimed is:

1. An apparatus for compensating for drift in position in a production of a three-dimensional object by stereolithography from a medium capable of solidification when exposed to a reaction means operating in a prescribed manner upon a working surface of the medium to provide successive adjacent solid laminae for forming the object including selective exposure of the medium to the reaction means between a first time and a second time, comprising:
- (a) a sensor capable of detecting the reaction means and mounted at a predetermined location fixed with respect to a point on the working surface of the medium;
- (b) positioning means for directing the reaction means based on use of positioning means information so that the sensor detects the reaction means, and selected positioning means information corresponding to the location of the sensor is determined;
- (c) means for comparing the selected positioning means information at the second time to reference positioning means information obtained from directing the reaction means at the sensor at the first time occurring before the second time in order to determine drift of the positioning means between the first and second times; and
- (d) means for compensating the positioning means for drift in position after the second time so that selective exposure of the medium after the second time occurs in registration with the selective exposure of the medium between the first and second times.

2. The apparatus of claim 1 wherein said reaction means is a beam.

3. The apparatus of claim 2 wherein said beam is a beam of electromagnetic radiation.

4. The apparatus of claim 3 wherein said beam of electromagnetic radiation is a beam of light.

5. The apparatus of claim 3 wherein said beam of light is a laser beam.

6. The apparatus of claim 2 wherein said beam is an electron beam.

7. The apparatus of claim 1 wherein said medium is a photopolymerizable resin.

8. The apparatus of claim 1 wherein said medium is a powder.

9. The apparatus of claim 1 wherein said medium is a liquid.

10. A method for compensating for drift in position in a production of a three-dimensional object by setereolithography from a medium capable of solidification when exposed to a reaction means operating in a prescribed manner upon a working surface of the medium to provide successive adjacent solid laminae for forming the object, including selective exposure of the medium to the reaction means between a first and second time, comprising the steps of:
 directing the reaction means by a positioning means based on positioning means information so that a sensor mounted at a predetermined location fixed with respect to a point on the working surface of the medium can detect each portion of the reaction means associated with particular positioning means information;
 determining reference positioning means information at a first time, from a relative intensity of each portion of the reaction means and from the particular positioning means information associated with each portion of the reaction means by determining best positioning means information associated with a centroid-like mathematical function of intensity of the reaction means;
 determining selected positioning means information at a second time, from the relative intensity of each portion of the reaction means and from the particular positioning means information associated with each portion of the reaction means by determining best positioning means information associated with a centroid-like mathematical function of intensity of the reaction means;
 comparing the reference positioning means information to the selected positioning means information in order to determine drift in position of the positioning means between the first and second times; and
 compensating for the determined drift in position after the second time so that the selective exposure of the medium after the second time occurs in registration with the selective exposure of the medium between the first and second times.

11. An apparatus for compensating for drift in position in a production of a three-dimensional object by stereolithography from a medium capable of solidification when exposed to a reaction means operating in a prescribed manner upon a working surface of the medium to provide successive adjacent solid laminae for forming the object including selected exposure of the medium to the reaction means between a first time and a second time, comprising:
 a plurality of predetermined sensor locations with associated X and Y coordinates and at least one sensor locatable at any one of the said predetermined sensor locations wherein each of the predetermined sensor locations is fixed with respect to a point on the working surface of the medium and wherein the plurality of predetermined sensor locations have different X coordinates and different Y coordinates;
 positioning means for directing the reaction means so that the at least one sensor detects the reaction means and supplies selected positioning means information corresponding to a desired set of at least two predetermined sensor locations;
 means for comparing the selected positioning means information at the second time to reference positioning means information obtained from directing the reaction means at the at least one sensor when located at the desired set of at least two predetermined sensor locations at the first time, occurring before the second time, in order to determine drift of the positioning means between the first and second times;
 means for compensating for drift in position with a polynomial correction function of order one less than the number of predetermined sensor locations in the desired set of at least two predetermined sensor locations after the second time so that the exposure of the medium after the second time occurs in registration with the selected exposure of the medium between the first and second times.

12. The apparatus of claim 11 wherein the selective exposure of the medium comprises the exposure of a first cross-section.

13. The apparatus of claim 12 wherein the desired set of at least two predetermined sensor locations comprises two predetermined sensor locations.

14. The apparatus of claim 13 wherein the polynomial correction function is first order and consists of a zeroth order term that compensates for an offset in position and a first order term that compensates for a gain in position.

15. A method for compensating for drift in position in a production of a three-dimensional object by stereolithography from a medium capable of solidification when exposed to a reaction means operating in a prescribed manner upon a working surface of the medium to provide successive adjacent solid laminae for forming the object, including selective exposure of the medium to the reaction means between a first and second time, comprising the steps of:

specifying a plurality of predetermined sensor locations with associated X and Y coordinates and at least one sensor locatable at any one of the said predetermined sensor locations wherein each of the predetermined sensor locations is fixed with respect to a point on the working surface of the medium and wherein the plurality of predetermined sensor locations have different X coordinates and different Y coordinates;

directing the reaction means by a positioning means based on positioning means information so that the at least one sensor can detect each portion of the reaction means and supplying particular positioning means information associated with each portion of the reaction means for each predetermined sensor location in a desired set of at least two predetermined sensor locations;

determining reference positioning means information for each predetermined sensor location in the desired set of at least two predetermined sensor locations at a first time, from a relative intensity of each portion of the reaction means and from the particular positioning means information associated with each portion of the reaction means by determining best positioning means information associated with a centroid-like mathematical function of intensity of the reaction means for each predetermined sensor location in the desired set of at least two predetermined sensor locations;

determining selected positioning means information for each predetermined sensor location in the desired set of at least two predetermined sensor locations at a second time, from the relative intensity of each portion of the reaction means and from the particular positioning means information associated with each portion of the reaction means by determining best positioning means information associated with a centroid-like mathematical function of intensity of the reaction means for each predetermined sensor location in the desired set of at least two predetermined sensor locations;

comparing the reference positioning means information to the selected positioning means information for each predetermined sensor location in the desired set of at least two predetermined sensor locations in order to determine drift in position of the positioning means between the first and second times; and compensating for drift in position with a polynomial correction function of order one less than the number of predetermined sensor locations in the desired set of at least two predetermined sensor locations after the second time so that the selective exposure after the second time of the medium occurs in registration with the selective exposure of the medium between the first and second times.

16. The method of claim 15 wherein the selective exposure of the medium comprises the exposure of a first cross-section.

17. The method of claim 16 wherein the desired set of at least two predetermined sensor locations comprises two predetermined sensor locations.

18. The method of claim 17 wherein the polynominal correction function is first order and consists of a zeroth order term that compensates for an offset in position and a first order term that compensates for a gain in position.

19. An apparatus for compensating for drift in position in a production of a three-dimensional object by stereolithography from a medium capable of solidification when exposed to a reaction means having various portions, operating in a prescribed manner upon a working surface of the medium to provide successive adjacent solid laminae for forming the object, including selective exposure of the medium to the reaction means between a first and second time, comprising:

positioning means for positioning the reaction means based on positioning means information;

a sensor mounted at a predetermined location fixed with respect to a point on the working surface of the medium for detecting each portion of the reaction means associated with particular positioning means information;

means for determining reference positioning means information at a first time and selected positioning means at a second time, from a relative intensity of each portion of the reaction means and from the particular positioning means information associated with each portion of the reaction means by determining best positioning means information associated with a centroid-like mathematical function of intensity of the reaction means;

means for comparing the reference positioning means information to the selected positioning means information in order to determine drift in position of the positioning means between the first and second times; and means for compensating for the determined drift in position after the second time so that the selective exposure of the medium after the second time occurs in registration with the selective exposure of the medium between the first and second times.

20. An apparatus for compensating for drift in position in a production of a three-dimensional object by stereolithography from a medium capable of solidification when exposed to a reaction means operating in a prescribed manner upon a working surface of the medium to provide successive adjacent solid laminae for forming the object, including selective exposure of the medium to the reaction means between a first time and a second time, comprising:

means for specifying a plurality of predetermined sensor locations with associated X and Y coordinates;

at least one sensor locatable at any one of the said predetermined sensor locations wherein each of the predetermined sensor locations is fixed with respect to a point on the working surface of the medium and wherein the plurality of predetermined sensor locations have different X coordinates and different Y coordinates;

positioning means for directing the reaction means based on positioning means information so that the at least one sensor can detect each portion of the reaction means and supply particular positioning means information associated with each portion of the reaction means for each predetermined sensor location in a desired set of at least two predetermined sensor locations;

means for determining reference positioning means information at a first time and selected positioning means information at a second time for each predetermined sensor location in the desired set of at least two predetermined sensor locations, from a relative intensity of each portion of the reaction means and from best positioning means information associated with each portion of the reaction means by determining the particular positioning means information associated with a centroid-like mathematical function of intensity of the reaction means for each predetermined sensor location in the desired set of at least two predetermined sensor locations;

means for comparing the reference positioning means information to the selected positioning means information for each predetermined sensor location in the desired set of at least two predetermined sensor locations in order to determine drift in position of the positioning means between the first and second times; and means for compensating for drift in position with a polynomial correction function of order one less than the number of predetermined sensor locations in the desired set of at least two predetermined sensor locations after the second time so that the selective exposure after the second time of the medium occurs in registration with the selective exposure of the medium between the first and second times.

* * * * *